(12) United States Patent
Cooper et al.

(10) Patent No.: US 7,404,681 B1
(45) Date of Patent: Jul. 29, 2008

(54) COATING METHODS AND APPARATUS FOR COATING

(75) Inventors: Samuel A. Cooper, Plano, TX (US); Joseph W. Daggett, Dallas, TX (US)

(73) Assignee: FSI International, Inc., Chaska, MN (US)

( * ) Notice: Subject to any disclaimer, the term of this patent is extended or adjusted under 35 U.S.C. 154(b) by 981 days.

(21) Appl. No.: 09/583,629

(22) Filed: May 31, 2000

(51) Int. Cl.
*G03D 5/00* (2006.01)
(52) U.S. Cl. .......................... 396/611; 118/52
(58) Field of Classification Search ................. 396/611, 396/627, 578, 604; 118/52, 54, 56, 500, 118/716, 319–321; 427/240, 425; 134/157, 134/402; 438/5, 780–782; 710/260; 700/121, 700/123; 355/27
See application file for complete search history.

(56) References Cited

U.S. PATENT DOCUMENTS

| | | | | |
|---|---|---|---|---|
| 4,688,918 A | | 8/1987 | Suzuki et al. ............... 396/611 |
| 4,932,353 A | | 6/1990 | Kawata et al. ................ 118/52 |
| 5,058,043 A | * | 10/1991 | Skeirik ........................ 700/167 |
| 5,066,616 A | | 11/1991 | Gordon ..................... 437/229 |
| 5,127,362 A | | 7/1992 | Iwatsu et al. .................. 118/52 |
| 5,260,174 A | | 11/1993 | Nakazawa et al. .......... 430/325 |
| 5,366,757 A | | 11/1994 | Lin ............................. 427/240 |
| 5,499,193 A | * | 3/1996 | Sugawara et al. ........... 700/268 |
| 5,532,192 A | | 7/1996 | Adams ........................ 118/52 |
| 5,599,394 A | | 2/1997 | Yabe et al. .................. 118/319 |
| 5,689,749 A | * | 11/1997 | Tanaka et al. ............... 396/611 |
| 5,766,671 A | | 6/1998 | Matsui ........................ 427/240 |
| 5,843,527 A | * | 12/1998 | Sanada ........................ 427/240 |
| 5,898,588 A | * | 4/1999 | Morimoto .............. 364/468.15 |
| 5,912,043 A | | 6/1999 | Choi et al. .................... 118/52 |
| 5,923,915 A | * | 7/1999 | Akimoto et al. ............. 396/604 |
| 5,985,357 A | * | 11/1999 | Sanada ........................... 427/8 |
| 6,074,443 A | * | 6/2000 | Venkatesh et al. .......... 29/25.01 |
| 6,097,469 A | * | 8/2000 | Yaegashi et al. ............ 396/611 |
| 6,168,665 B1 | * | 1/2001 | Sakai et al. .................. 118/500 |
| 6,168,672 B1 | * | 1/2001 | Nguyen ........................ 134/18 |
| 6,378,022 B1 | * | 4/2002 | Moyer et al. ................. 710/260 |
| 6,383,948 B1 | | 5/2002 | Kitano et al. |
| 6,391,111 B1 | * | 5/2002 | Fujimoto et al. ............ 118/321 |
| 2001/0012971 A1 | * | 8/2001 | Nguyen ...................... 700/121 |
| 2002/0124798 A1 | | 9/2002 | Kitano et al. |

FOREIGN PATENT DOCUMENTS

| | | |
|---|---|---|
| EP | 0 829 767 A1 | 3/1998 |
| EP | 0 863 538 A2 | 9/1998 |
| JP | 9148231 | 6/1997 |
| JP | 9270373 | 10/1997 |
| JP | 10209022 | 8/1998 |
| JP | 11204416 | 7/1999 |

* cited by examiner

*Primary Examiner*—Della J. Rutledge
(74) *Attorney, Agent, or Firm*—Kagan Binder, PLLC (57) ABSTRACT

Described are process control methods for spin-coating, and apparatuses and devices incorporating the same, wherein the method is useful for application of developer solution to a substrate, and wherein the process control method includes one or more features of: interrupted serial process control using an interrupt signal from a hardware or a software component, an interrupt service routine, and a multiple process commands initiated at durations measured in parallel from an earlier process event.

8 Claims, 7 Drawing Sheets

COATING METHODS AND APPARATUS FOR COATING

FIELD OF THE INVENTION

The invention relates to spin-coating methods and apparatuses useful for applying materials onto substrates such as semiconductor wafers or other microelectronic devices. The methods and apparatuses relate to the timing control of steps of spin-coating processes.

BACKGROUND

Certain manufacturing processes call for coating thin films of materials onto various commercially important substrates. One method that has been used commercially for applying materials onto a substrate is spin processing or spin-coating, using a spin-coater. A spin-coater allows placement of a quantity of a material onto a substrate, and can rotate the substrate about its central axis through one or a series of rotational speeds. Centrifugal action causes the material to spread out over the surface of the spinning substrate, e.g., into a thin, uniform film.

More generally, processing of various commercially important substrates, e.g., microelectronic devices such as semiconductor wafers and integrated circuits, requires that some process steps be limited to well-defined areas of the surface of a substrate. This is true, for example, in processing microelectronic devices, to precisely place different materials onto a semiconductor wafer to construct circuit designs. A step of such a process is to precisely delimit the different areas of the substrate that must be either processed or protected from the actions of non-applicable materials and processing steps. A common method of processing such substrates is to use photolithography and spin-coating.

Photolithography is used to selectively protect or expose areas of a substrate such as a microelectronic device. A coating of a photosensitive photoresist material is spin-coated as a thin layer onto the device. The photoresist layer is exposed to electromagnetic energy through a patterned photomask, causing a chemical reaction within the exposed photoresist material, but not within the materials of the masked area (i.e., not exposed to electromagnetic energy). Afterwards, a developer solution is applied or spin-coated onto the entire photoresist material. The developer solution causes either the exposed or unexposed areas of the photoresist to be "developed" and allows removal of the developed or undeveloped photoresist. If the photoresist is of a so-called negative type, the unexposed area of the coating can be developed and removed; if the photoresist is of a so-called positive type, the exposed regions of the photoresist coating can be developed and removed. In both types of photolithography, the remaining photoresist forms a protective layer in either a positive or a negative pattern of the photomask that allows further processing of the exposed areas while protecting the areas covered by the photoresist.

The thickness of the photoresist layer (just prior to exposure) can have significant effects on one or more of the quality, performance, and cost of manufacture of the end product microelectronic device. The thickness of the exposed and developed photoresist layer can affect the size and resolution of features that can be constructed on the substrate using the photoresist layer. A thinner layer will allow finer features and finer resolution of features, based on a range of useful aspect ratios (i.e., height versus width) of the features. Additionally, when using monochromatic light to expose a photoresist layer, the light can pass through the layer and be reflected, thereby causing either constructive or destructive interference. A desired film thickness can be designed to operate at either a maxima or minima of the thin film interference/swing curve.

To produce small features in a uniform fashion, the uniformity of the photoresist layer is also important, meaning both the uniformity of the thickness of a photoresist film on a single substrate (the "intra-wafer uniformity") and the uniformity of the (average) thickness between different coatings applied to different substrates (the "inter-wafer uniformity"). The intra-wafer uniformity is important, e.g., because it provides uniformity of the feature sizes of components placed on any given device. Inter-wafer uniformity is important, e.g., because producing coatings having predictably uniform thickness allows the production of devices having uniform and consistent quality.

As explained, the developed photoresist layer is a product of a multi-step process including coating a photoresist solution and coating a developer solution (after exposing the photoresist). Both of the process steps and their related materials can be key in producing a developed photoresist layer with uniform and predictable thicknesses, and with uniform feature sizes.

Spin processing methods attempt to provide coating uniformity by closely monitoring and/or controlling process conditions, materials, and individual process commands, to cause execution of spin-coating process steps in a uniform, repeatable fashion. This is generally accomplished by programming a computerized process control system to cause uniform execution of individual process steps with repetitive, predicted, timing and conditions, according to a pre-programmed set of events. Moreover, due to the very small dimensions and tolerances involved, factors surrounding the process that might otherwise be considered insignificant can have frustratingly real consequences in causing variability and non-uniformities of spin-coated materials. These can include the viscosity and temperature of the processing solution, spin speed and acceleration, process timing delays, air movement and velocity in the coating apparatus, ambient humidity, ambient temperature, ambient barometric pressure, chemical dispense system parameters, small variations in timing, mechanical impingement of applied processing solutions, etc. Certain methods exist to monitor and compensate for some of these factors to reduce their effects on the thickness of spin-coated materials.

Figure 1:
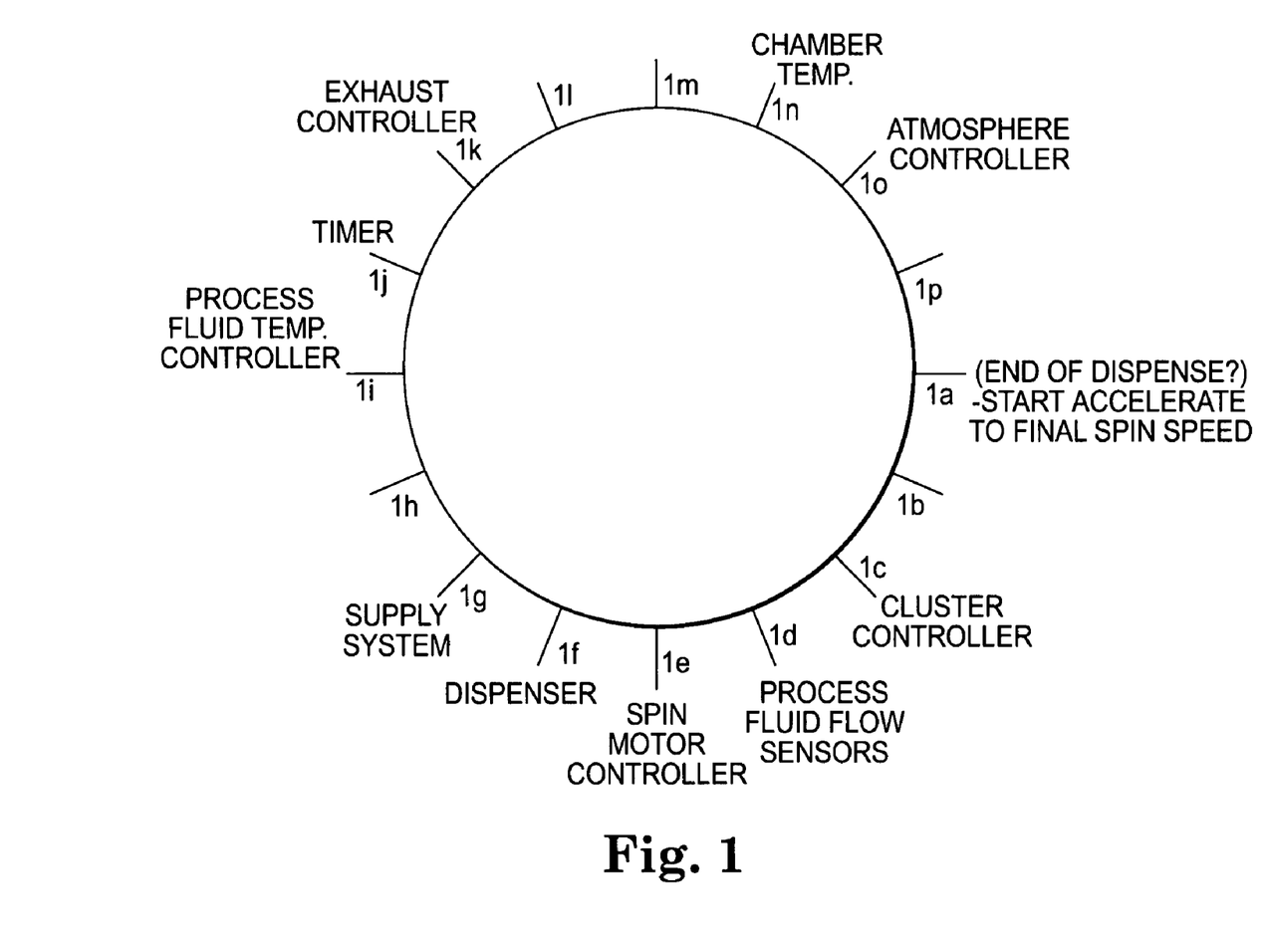
FIG. 1 is a diagram illustrating an exemplary round-robin-type control algorithm.

Spin-coating processes typically account for and control processing conditions using a computerized process control system. One system often used for controlling spin-coating processes involves serial process control, e.g., a "round-robin"-type control process. In a serial-type control process, an electronic or computerized unit monitors and controls various elements of a spin-coating apparatus using a sequential or serial methodology. The process control system operates generally according to a continuous, serial (e.g., circular) path, sequentially addressing pre-identified components of the apparatus in a pre-determined order that does not vary (see FIG. 1). In practice, a computer or central processing unit (CPU) can be programmed to sequentially address one subroutine at a time. In FIG. 1, subroutines are represented by the rays emanating from the path followed by the CPU. The CPU addresses a subroutine, performs the instructions of the subroutine by checking conditions or parameters and taking any instructed action, and after any such action is taken, moving to the next subroutine.

Limits remain on the levels of coating uniformity attainable by spin-coating using methods of process control and methods of monitoring, controlling, or compensating for external conditions. This is especially true as feature sizes of microelectronic devices become smaller, and tolerances for variations in feature size become more demanding.

SUMMARY OF THE INVENTION

The invention relates to spin-coating processes, and more specifically, to methods and apparatuses wherein spin-coating is controlled using a process control system that interrupts serial process control to execute process commands, thereby reducing or eliminating variations in timing associated with the serial process control.

Conventional computer process control systems introduce timing variations into spin-coating processes that can be significant enough to cause noticeable variations in the inter-wafer and intra-wafer thicknesses of coated photoresist solutions, and in line width repeatability of a developed photoresist coating.

Serial-style, e.g., round-robin-style, process control systems cause timing variations because process parameters are addressed sequentially through a series of subroutines in a predetermined, fixed fashion. At each subroutine, conditions are monitored and data is collected, recorded, and (if required by the programmed instructions) acted upon, and the updated data is passed to the next subroutine. An example of a simple round-robin algorithm is shown in FIG. 1. This process control system moves through a path (shown as circular) from one subroutine to the next. Each subroutine addresses one or more different parameters (e.g., through sensors or by addressing hardware) of the spin-coating apparatus, e.g., temperatures of various components, such as chuck temperature, solution temperature, or ambient temperature; whether or not a process step has started or been completed, e.g., start or end of dispense; process chemical temperature control; a timer; the spin motor (checking for speed or acceleration); pump; dispense lines; dispense arm (position); and general conditions inside of the spin-coating apparatus.

To present an example of timing variability inherent in this system, consider a process wherein the process control system calls for spinning the turntable at the end of the dispense of processing solution from the dispense arm. The exact moment when the end of dispense occurs cannot be predicted, and might occur while the computer is addressing any one of the other subroutines unrelated to the turntable or the dispense arm. Referring to FIG. 1, subroutine 1a checks whether the end of dispense has occurred, and if so starts the turntable. If the end of dispense has occurred, for example, while the CPU was addressing subroutine 1f, relating to the dispense arm, the CPU does not act on the end of dispense information until the remaining subroutines are addressed—this may take a time in the range of tens of milliseconds, e.g., up to 30 or 50 milliseconds (e.g., for POLARIS® spin-coating apparatus from FSI International of Chaska, Minn.), or even more, depending on the specific machine, process control system, the lengths of the different intervening subroutines, and the number of subroutines that the CPU must traverse after the actual end of dispense in getting to the turntable subroutine where such information will then be acted upon.

A millisecond-range time delay may at first seem to be insignificant. But when dealing with small dimensions and tolerances related to modern spin-coated materials, even milliseconds can be significant. Timing delays in these ranges can produce detectable variations in film thicknesses and uniformity, and in line width repeatability (inter-wafer and intra-wafer) of processing solutions coated, applied, or otherwise processed using spin-coating techniques. For example, in spin-coating a photoresist material, timing variations in this range have been found to cause thickness variations in a spin-coated photoresist layer, measured right before exposure, in the neighborhood of 1.3 angstroms per 10 millisecond delay. When applying developer solution using spin-coating methods, timing variations in the millisecond range have been found to cause variations in line width repeatability of a patterned photoresist layer in the neighborhood of approximately 1 angstrom per 10 millisecond delay.

Figure 2:
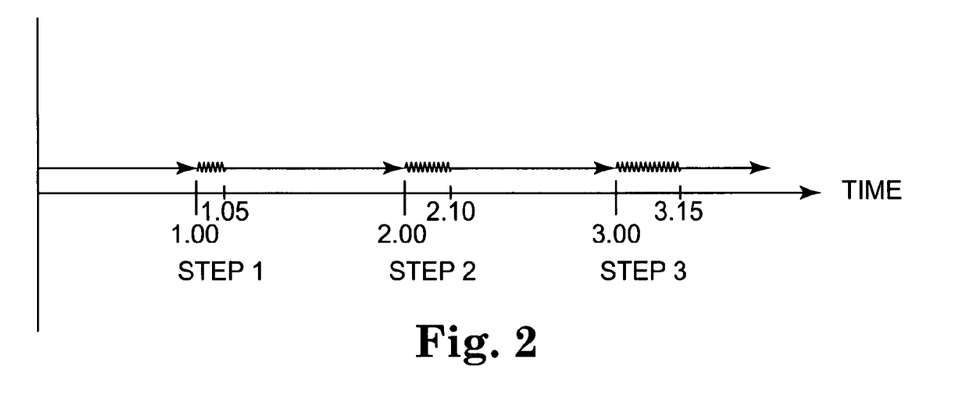
FIG. 2 is a diagram illustrating the introduction of timing variabilities in a sequence of spin-coated process steps controlled using serial process control.

An even more significant problem with round-robin-type process control systems is that not only do they introduce timing variabilities into a single step of a spin-coating process, but they carry the variability to subsequent steps, allowing the variabilities to accumulate. FIG. 2 illustrates how timing variabilities can be accumulated through a process as variation in the timing of earlier process steps are carried downstream to affect subsequent steps. The beginning of one step is based on the end of an earlier step. This often occurs over a series of steps within the spin-coating process. In FIG. 2, an exemplary spin-coating process proceeds through steps including step 1 (e.g., dispense), step 2 (e.g., accelerating spin), and step 3 (e.g., movement of dispenser). The x-axis shows timing of the series of steps, with the start of each step (beginning with the second step) being prompted by the end of the previous step. As such, at the end of step 1, the computer recognizes the end of the step and initiates the command for step 2. Likewise, at the end of step 2, the computer recognizes the end of the step and initiates the command for step 3. This continues through the programmed series of consecutive process steps.

As is shown in the figure, variability of the timing of each process step accumulates as the program sequentially proceeds through subsequent steps. Specifically, the occurrence of the end of step 1 will be detected and acted upon at some time within 50 milliseconds (0.050 s) after it actually occurs. If the event actually occurs at exactly 1.00 second after the timer begins, the system will detect and use the information at a time within a period from 1.00 to 1.05 seconds. Step 2 is initiated upon detection of the end of step 1. Step 2 introduces its own timing variability of around 50 milliseconds (0.050 s), and if step 2 is programmed to complete at a time of 2.00 seconds, it will complete and be detected at a time in the range from 2.00 to 2.10 seconds. The end of a third step initiated from the end of the second step will include yet another layer of variability added to the first two, e.g., a variability of up to 0.15 seconds. In short, when the timing of subsequent events or commands of a spin-coating process are related to the timing of preceding events, as in standard serial-type process control systems, the variability in timing of each step accumulates as the process proceeds through consecutive steps.

The result of these variabilities, especially when compounded through a series of steps, can result in variation in the intra-wafer and inter-wafer properties of materials applied by spin-coating. For example, substrates spin-coated with photoresist using serial or round-robin-type control programs can have photoresist film thickness variations of up to +/−25 angstroms (3 sigma), when measured after soft bake and prior to exposure. In applying a developer solution using spin-coating techniques, variations in timing within these ranges can cause variation in line width repeatability of a developed photoresist film of about 8 mm inter-wafer, and about 10 mm intra-wafer (3 standard deviations).

In one sense, the invention relates to the idea that serial spin-coating process control systems such as round-robin-type systems include timing variabilities that can affect the thickness and uniformity of materials that are applied by spin-coating, using such process control systems. The invention reduces variabilities in timing, film coating thickness, and line width repeatability, by eliminating lag time between steps in serial process control. Specifically, the invention can eliminate process delays that occur between the time when an event (i.e., a triggering event) occurs and the time when the event is detected and used to initiate a subsequent process command. Moreover, the invention does not suffer from having a later step being initiated by the end of an earlier step. Instead, process steps can be individually timed and executed in parallel, e.g., separately, using separate timers to measure individual durations.

Generally, a process control system according to the invention can operate in a serial process control mode, but the inventive system is programmed to be interrupted upon a trigger event, at which interruption the system will promptly perform the next process command, i.e., without delaying by addressing intervening subroutines of the serial process. The process command can preferably be a command whose timing affects the uniformity of a spin-coated material. The uniformity of application of the spin-coated material is improved, because the interruption and prompt execution of the process command avoids the delay associated with serial-style process control.

As a different advantage, the inventive process can avoid the accumulation of timing variability caused by the timing of subsequent process steps being based on earlier steps, for example, the process control system can interrupt serial control to initiate timing of multiple durations between spin-coating process events and subsequent spin-coating process commands. E.g., the process control system executes an interrupt service program (ISP) which contains instructions for two or more timers that are initiated to time zero upon receipt of an interrupt signal, one separate timing device for each duration. Upon reaching the end of the duration for each timer, the process control is again interrupted to execute a predetermined process command, and thereafter resumes serial process control. When the end of the second duration is reached, control is again interrupted to execute the second process command, and so on, for as many timers and process commands as are included in the interrupt service routine. Advantageously, each process command can be independently controlled to execute at a time that is within the accuracy of the timer. The durations are measured in parallel, not in series, so variabilities do not accumulate.

The process control methods of the invention can be used in processes of spin-coating developer solution onto a substrate, and can be used in processes of spin-coating photoresist solution onto a substrate followed by spin-coating developer solution onto a substrate. This provides improved coating uniformity for each spin-coated material, which provides for particularly uniform thickness of the developed and patterned photoresist layer. When a developing solution is applied in this manner over a spin-coated photoresist material, and wherein each spin-coating process uses interrupted timing methods as described herein, uniformity of the photoresist layer (when measured after soft bake and before exposure) can be as little as or less than 15 angstroms (3 sigma) preferably less then 5 angstroms (3 sigma) (for both intra-wafer and inter-wafer). The process can also produce a photoresist coating having line width repeatability of from 9 nanometers (3 sigma) intra-wafer and 6 nanometers (3 sigma) and inter-wafer, measured after a hard bake.

The invention further contemplates spin-coating apparatuses capable of operating with the inventive process control methods, e.g., being programmed with software instructions according to the inventive method. In one embodiment, interrupted timing is used to control at least a portion of a spin-coating process, preferably using multiple timers in parallel.

Most preferably, a hardware interrupt causes a process control system to enter an interrupt service routine which instructs the system to use interrupted timing control, with parallel timers, to execute one or more time-sensitive commands. The interrupt service routine includes the steps of setting two or more timers to run in parallel during the interrupt service routine for durations preferably starting together at the time of the trigger event. Different process commands (which may or may not be, but can preferably be time-sensitive process commands) are executed at the end of each duration.

In brief, serial process control systems can cause 30 to 50 millisecond (0.030-0.050 s) delay for every step in a series of process commands, e.g., from the time after an event has occurred but before the occurrence is detected and acted upon. This variability alone can be significant in affecting the uniformity of spin-coated materials, but becomes more significant as variabilities accumulate due to the starts of later steps being based on the ends of previous steps. The inventive, interrupt-driven process control methods can allow no more then 5 millisecond variation in any one step, early or late in a sequence, thus eliminating the variability in timing of individual process steps. Furthermore, with parallel timing of one or more durations of the process, accumulation of even these reduced variabilities through a series of process steps can be eliminated.

An aspect of the invention relates to a method for controlling a process of applying a developer solution onto a substrate using a spin-coating apparatus. The method comprises controlling the process using serial process control wherein the process is controlled by sequentially executing a series of subroutines, and interrupting the serial process control with an interrupt signal to execute a process command.

Another aspect of the invention relates to a method for providing a photoresist coating onto a substrate. The method comprises spin-coating a photoresist solution onto the substrate. The spin-coating process is controlled by a method comprising controlling the process using serial process control wherein the process is controlled by sequentially executing a series of subroutines, and interrupting the serial process control with an interrupt signal to execute a process command. The method further comprises applying a developer solution onto the spin-coated photoresist using a spin-coating apparatus wherein the spin-coating apparatus is controlled using serial process control sequentially executing a series of subroutines, and interrupting the serial process control with an interrupt signal to execute a process command.

Yet another aspect of the invention relates to a method of spin-coating a developing solution onto a microelectronic device. The method comprises executing process commands at durations measured in parallel from an earlier process event.

Yet another aspect of the invention relates to a method of controlling a develop solution spin-coating process. The method comprises the use of a process control system programmed with an interrupt service routine, wherein upon a trigger event, a hardware interrupt is sent to the process control system. Upon receipt of the hardware interrupt, the process control system executes an interrupt service routine. The interrupt service routine includes the steps of setting two or more timers to run in parallel for durations, and sending a software interrupt at the end of each duration to interrupt the process control system and execute a process command.

Yet another aspect of the invention relates to a method of controlling a process for spin-coating a developer solution. The method comprises initiating two or more separate process commands at durations measured in parallel from one or more earlier process events, to avoid timing variabilities otherwise caused by serial timing methods.

Yet another aspect of the invention relates to a spin-coating apparatus comprising a process control system programmed to control developer solution spin-coating steps which include initiating process commands at durations measured in parallel from one or more earlier process events.

Yet another aspect of the invention relates to a spin-coating apparatus comprising: a turntable to support and rotate a substrate; a dispensing arm moveable between a dispensing position and a non-dispensing position; a supply of developer solution in fluid communication with the dispensing arm; and a process control system to control application of the developer solution onto the substrate, the process control system being programmed to interrupt serial control to execute a process command.

Yet another aspect of the invention relates to a spin-coating device comprising a process control system programmed to execute developer solution spin-coating steps including timing different process commands in parallel using two or more timers, to avoid accumulation of timing variability in subsequent processing commands caused by serial timing methods.

DETAILED DESCRIPTION

Spin-coating is a method of applying processing solutions onto substrates as a uniform film or coating.

A variety of substrates are known to be amenable to application of materials to their surfaces using spin-coating techniques. These include microelectronic devices such as integrated semiconductor circuits (e.g., semiconductor wafers), display screens comprising liquid crystals, electric circuits on boards of synthetic material (circuit boards), and other commercially significant materials and products.

The processing solution can be any material known to be usefully applied or coated using spin-coating techniques and apparatuses. Examples include photoresist materials and developer solutions used in photolithographic methods, as explained infra. The invention also contemplates the application or coating of other materials using spin-coating methods, such as the application of spin-on dielectrics, spin-on glass, spin-on dopants, or low k dielectrics, where such processing solutions require subsequent application of a developing solution. As an example, the inventive method could be used to apply a photodefinable spin-on dielectric material such as a polyimide, followed by a developer solution. Thus, while the process is described in the context of semiconductor wafers and photolithography, especially to spin-coating a photoresist solution followed by applying a developer solution by spin-coating, the invention is not limited to such specific applications.

Semiconductor wafers can be spin processed, e.g., in combination with photolithographic methods and materials, using one or more steps that involve spin-coating. Exemplary steps involved in processing to deposit a patterned photoresist material onto a substrate can include one or more of cleaning or priming a surface; heating or chilling (once or multiple times throughout a sequence of steps in a larger process); applying photoresist solution onto a substrate; exposing the photoresist material, e.g., using a mask and radiation; additional heating and chilling steps; application of a developer solution using spin-coating techniques, along with rinsing away the developer solution and regions of photoresist to leave behind a patterned photoresist; and final heating and chilling, if desired. An exemplary series of one variation of such steps is provided below.

A substrate can first be prepared for deposition of a photosensitive photoresist coating on a surface. Preparation might include cleaning, and often includes dehydrating with elevated temperature and reduced pressure, and priming the surface with a material that promotes adhesion between the substrate surface and the photoresist material, e.g., hexamethyldisilazane (HMDS).

A next step might involve bringing the temperature of the wafer back to ambient, for instance by chilling the wafer using conventional methods and equipment such as a chill plate.

Next, a photoresist material can be applied to the substrate, preferably as a thin, uniform film. The photoresist may be applied using any of a variety of known and useful techniques, including lamination, extrusion techniques, spray-on coating techniques, chemical vapor deposition, or, as is preferred in the practice of the invention, spin-coating, most preferably using process control methods as described herein. The spin-coated photoresist layer can be coated to have a desired thickness chosen based on the needs of the device for which the substrate is designed. Typically the layer can be considerably thin, for example of a thickness in the range from 50 microns to 0.5 microns, or less. Additional information relating to preferred details of a photoresist solution spin-coating process in the context of using process control according to the invention, is provided infra.

After application of the photoresist solution in the form of a spin-coated layer, a typical next step is to drive solvents from the photoresist solution, for example by baking. This step is sometimes referred to as a "soft bake" or "post-apply bake." The exposure time and temperature can be any that are effective to drive solvents out of the photoresist solution.

Following a post-apply bake, the temperature of the substrate can be reduced, for example to ambient temperature, optionally with the use of a chill plate.

The photoresist material, effectively eliminated of solvent, can be selectively exposed, e.g., through a mask, to a source of energy to cause reaction of portions of the photoresist, as is known in the art of silicon wafer processing. A mask may be any type known to be useful with a selected substrate, photoresist, and process. Any of various well-known types of masks and masking techniques and equipment can be useful. The radiation may be any form or wavelength of radiation, and should be chosen according to the chemistry and design of the photoresist solution. Preferred radiation is often of a single wavelength, i.e., monochromatic, because many preferred photoresist materials are monochromatically curable.

After radiation exposure, a typical next step can be to again raise the temperature of the substrate and the exposed photoresist. This time heating may be performed for reasons such as to address standing wave phenomena using a diffusion mechanism for exposed versus unexposed regions and/or to complete a chemical reaction of the photoresist material, e.g., for chemically amplified photoresists. This typically can be accomplished with a "post-exposure" bake, which can be followed by returning the substrate to ambient temperature.

A developer solution is applied to the photoresist-coated substrate surface by spin-coating. According to the invention, this step is accomplished using process control that involves an interrupt-driven control method, as described herein. The developer "develops," e.g., reacts with, breaks down, or dissolves, either the exposed or the unexposed portion of the photoresist material, allowing one or the other of the exposed or unexposed photoresist material to be washed away and removed, leaving behind a patterned photoresist.

Developer solutions are well known, and according to the invention can be any of a variety of compositions that effectively and selectively react with, break down, or dissolve a material previously applied to a substrate, e.g., photoresist. When developing photoresist, this allows selective removal of a region of photoresist, leaving behind a patterned photoresist layer. Such developer solutions are known in the semiconductor wafer processing art. Some are considered to be specifically useful with certain types of photoresist materials and may be matched with the use of those photoresists. Examples of useful types of developing solutions include water-based materials, e.g., aqueous caustic compositions such as aqueous tetra-methyl ammonium hydroxide (TMAH). Other developer compositions include sodium hydroxide or potassium hydroxide solutions, e.g., aqueous sodium hydroxide or aqueous potassium hydroxide. A developer solution might also include other materials that will facilitate developing or removal of a photoresist, e.g., surfactants.

After application of the developing solution, the substrate can optionally be baked (the "hard bake") and chilled once again.

Equipment for performing one or more of these processing steps is known in the arts of photolithography and semiconductor processing, and includes spin-coating apparatuses, chill plates, hot plates, ovens, etc. Such types of equipment are commercially available, and are often sold and used together in "clusters" for efficient processing of multiple steps between different pieces of equipment. A preferred spin-coating apparatus for coating photoresist and/or developer solution is of the type sold by FSI International, of Chaska, Minn., under the trade designation POLARIS®.

Figure 3:
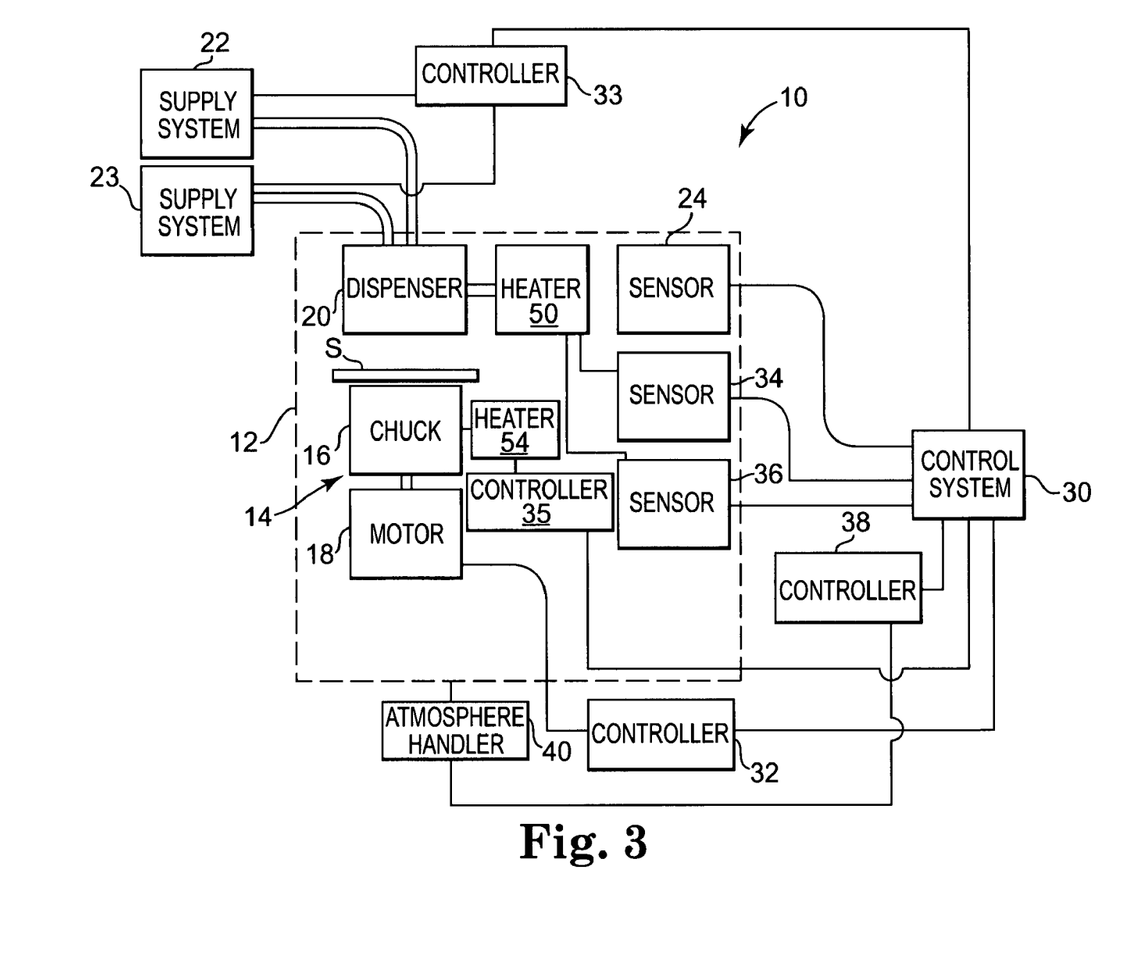
FIG. 3 is a block diagram of an exemplary embodiment of a spin-coating apparatus.

FIG. 3 is a block diagram illustrating an embodiment of a spin-coating apparatus such as the POLARIS 2500®. Apparatus 10 is adapted to coat one or more processing solutions onto a substrate. Apparatus 10 includes a chamber 12 housing a rotatable support 14 which comprises a chuck 16 connected to a motor 18. A substrate S is mounted, e.g., by means of vacuum suction or the like (not shown) to chuck 16. The substrate S and chuck 16 are rotated by the motor 18 during steps of the spin-coating process.

Included in apparatus 10 is a dispenser 20 for providing one or more processing solutions (e.g., photoresist, deionized water, developer solution, solvents such as edge bead removal solvent, etc) onto substrate S. Dispenser 20 can be of any design that will allow application of a processing solution onto substrate S. (Generally, the same spin-coating apparatus is not used to apply both photoresist and developer solution). Optionally and preferably, the dispenser, e.g., at the dispensing arm, may have multiple dispensing nozzles to allow dispensing of two or more different processing solutions from the same dispenser or dispensing arm.

Dispenser 20 can comprise a dispensing arm or manipulator (not shown) moveable between different positions to facilitate dispensing a processing solution onto substrate S. A dispensing arm may be moved between a dispensing position where the arm is in a position generally over a surface of the substrate S, and a non-dispensing position where the dispensing arm is out of the way. As another example, especially when dispensing a developer solution, a dispensing arm may be moved over a rotating substrate while dispensing, to apply a developer solution in a spiral pattern. In other embodiments, a dispenser or dispensing arm may include manifold dispensing points for a single processing solution (e.g., developer solution) and may not require movement to apply developer solution in a circular or spiral pattern.

The dispenser 20 is connected to at least one supply system 22 for supplying a processing solution, preferably one supply system for each processing solution used in the apparatus. Exemplary FIG. 3 shows apparatus 10 having two supply systems, 22 and 23. The dispenser 20 and supply systems 22 and 23 can be of conventional design and adapted to use conventional techniques to maintain a processing solution in a condition to be supplied through the dispenser 20 onto substrate S. For example FIG. 3 shows dispenser 20 connected to heater 50 for maintaining a desired temperature of one or more processing solutions. A suitable dispenser and supply system for use in a system such as that shown in FIG. 3 can be found in the POLARIS® Microlithography Cluster manufactured by FSI International, Inc., Chaska, Minn.

A supply system such as supply system 22 or 23 can include components including a pump, temperature control mechanisms, optional filters, sensors such as temperature sensors, volumetric flow sensors, etc. Also, supply systems 22 or 23 can be connected to a controller 33 and to process control system 30.

FIG. 3 shows a process control system 30 that includes componentry, e.g., hardware, software, or a combination of both, that, in combination with sensors, monitors, controllers, and features of the hardware, electronically controls a spin-coating apparatus and spin-coating processes performed using the apparatus. Chamber 12 includes sensors 34 and 36 that provide input signals to the process control system 30 relating to temperatures of the process solutions supplied from supply systems 22 and 23. Apparatus 10 further includes an atmosphere handler 40 in fluid communication with chamber 12 and adapted to process the atmosphere in the chamber 12 to desired temperature and humidity conditions, as well as to optionally provide desired air flow within the chamber to maintain desired (e.g., laminar) flow over a substrate. Atmosphere handler 40 includes sensors (not shown) for sensing temperature, humidity, and air flow inside of chamber 12.

Chamber 12 encloses the apparatus so that desired environmental conditions suitable for applying a processing solution onto a substrate S can be maintained and/or controllably adjusted. The environmental chamber 12 allows the temperature and humidity of the chamber 12 to be set at particular levels for processing. By holding these factors constant, variations in temperature and humidity that would cause variability in the application of a processing solution to a substrate can be reduced or eliminated. The environmental chamber 12 also serves as a barrier against particulate and other contaminants, and can be used to control air flow within the chamber to facilitate particulate removal. Chamber 12 and apparatus 10, particularly with respect to rotatable support 14, are generally adapted to allow access to the interior of chamber 12 so that substrate S can be mounted on and removed from the chuck 16.

A suitable atmosphere within chamber 12 can depend on the type of coating process and processing solution involved in the process. The atmosphere can be a vacuum, air, or an inert gas such as He, Ar, $N_2$, or the like, or a combination thereof. Remote atmosphere handler 40 can be designed to establish the desired chamber temperature and humidity by first chilling the atmosphere to be circulated into the chamber 12 in order to dry the atmosphere. Once dried, the atmosphere is heated and humidified to the desired temperature and humidity level. The processed atmosphere is then transferred into the chamber 12. As an option, a re-circulation loop could also be used to partially re-circulate the atmosphere from the chamber 12 back to the remote atmosphere handler 40.

Optionally and preferably, a barometric pressure sensor 24 can be located within or proximal to apparatus 10 to measure some parameter indicative of the barometric pressure inside of chamber 12, preferably in such a way that the measured parameter is indicative of barometric pressure near the substrate S. For example when using the POLARIS® Microlithography Cluster, a suitable placement is within the coater module in a non-turbulent, shrouded position so as to eliminate air flow effects upon the sensor 24. In a preferred embodiment, the barometric pressure sensor 24 can be a PTB 100 series analogue barometer manufactured by Vaisala Oy, Helsinki, Finland. The use of a barometric pressure sensor in a spin-coating process is described in Assignee's copending U.S. patent application Ser. No. 09/397,714, filed Sep. 16, 1999, incorporated herein by reference.

Process control system 30 uses signals from different elements of the processing apparatus, e.g., sensors, controllers, hardware elements, etc., to control the apparatus and the processes accomplished in the apparatus. Process control system 30 accepts input signals from such elements and generates output signals based on the input signals, and the output signals instruct and control the process, preferably to cause desired and optimal spin processing of processing solutions onto a substrate. The apparatus may also incorporate other devices and methods useful in disposing a uniform coating of a process solution onto a substrate, as described, e.g., in U.S. Pat. Nos. 4,932,353; 5,066,616; 5,127,362; 5,532,192; each of which is incorporated herein by reference.

Process control system 30 can be any electronic, programmable process control system that is useful to monitor and control systems such as a spin-coating apparatus. Process control system 30 may comprise an electronic computerized processor such as a central processing unit (CPU) or a programmable logic controller (PLC), or the like, which preferably contains an internal clock. Random access memory (RAM) can preferably be used to store a software program containing instructions according to the invention. One or more timers can be programmed into the RAM to measure durations by referencing the internal timer of the processor. External storage devices such as a floppy disk drive, CD ROM, or the like can optionally be electronically connected to the processor for transferring information in one or two directions. The process control system is electronically connected to a spin-coating apparatus, e.g., to hardware or controllers thereof.

Figure 4:
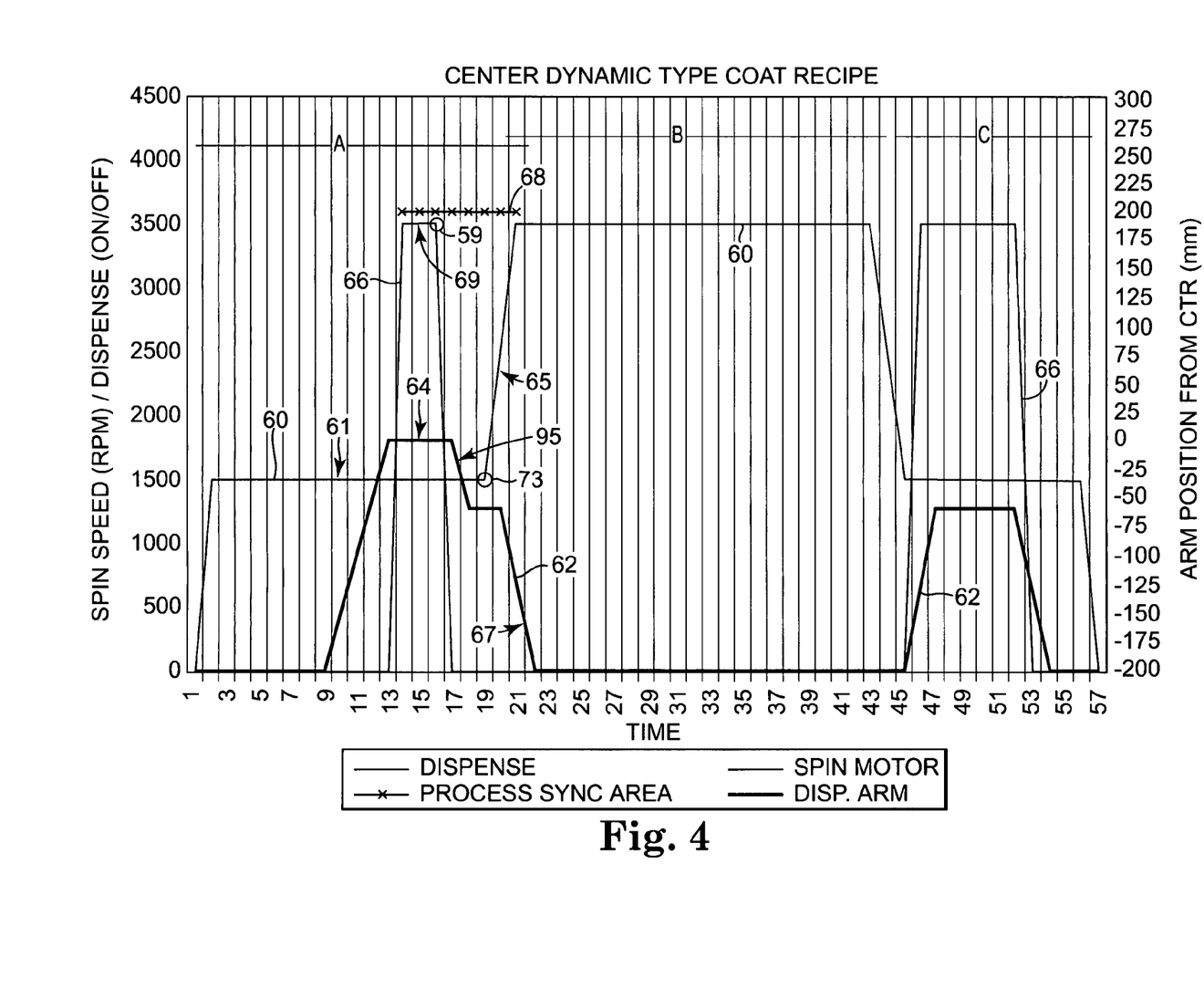
FIG. 4 is a diagram of steps of spin-coating a photoresist solution onto a substrate using a spin-coating apparatus.

FIG. 4 illustrates typical steps involved in spin-coating a photoresist solution onto a substrate. Line 60 represents the rotational speed of the spin motor through the process. Line 62 represents the position of a dispense arm. Line 66 represents the dispensing of processing solution onto the substrate. Crossed line 68 identifies a "time-sensitive portion," which means that it includes one or more "time-sensitive steps," the timing of which has been found to show measurable effects on the thickness and/or uniformity of a spin-coated photoresist.

The process can proceed generally as follows. Once a substrate is installed into the apparatus, spin-coating a photoresist can include three general portions: dispensing an amount of photoresist onto the substrate (dispensing portion -A-) (the early portion of dispense portion -A- is sometimes referred to as the "pre-dispense"), casting the photoresist to form a uniform film (-B-), and removal of edge bead/backside rinse (-C-). (These portions being generally defined, their boundaries are not exact.)

In dispensing portion -A- photoresist solution is applied to a surface of a substrate. Early in the process, the turntable is shown to start spinning by accelerating to a dispense speed, shown as plateau 61. The dispense spin speed can be any speed that will allow dispensing of the photoresist solution onto the substrate to form a film or layer over the entire substrate surface in an efficient amount of time. The turntable speed will depend on factors such as the size of the wafer, but a typical dispense spin speed for a 200 mm diameter wafer might be in the range from about 1000 to about 2000 rpm, for example about 1500 rpm.

The photoresist solution can be applied in any fashion that will allow casting to a uniform film. The amount of photoresist solution applied can be important in providing a uniform photoresist film (at least a minimum amount is needed to form a film over the entire area of the substrate). As such, the dispense can preferably be monitored in terms of the amount of material dispensed, by considering the actual amount dispensed or the timing of the dispense.

Preferably (and as shown), but not necessarily in all embodiments of the invention, dispensing of the photoresist solution onto the substrate surface can occur with spinning of the substrate. In a preferred embodiment, photoresist solution can be dispensed onto the substrate while the substrate rotates at a dispense speed, in an amount sufficient to cause the entire area of the substrate surface to be wetted, i.e., in an amount that is at least enough to create a complete layer of photoresist solution over the entire area of the substrate. When sufficient photoresist solution has been applied to cover the surface of the substrate, this is a good time to stop the dispense of photoresist solution and accelerate to casting or final spin speed. (As described below, it can be preferred to first move the dispense arm out of a position above the substrate.)

The dispense step typically involves movement of a dispense arm before, during, and after actual dispense. Specifically, during dispense portion -A-, the dispense arm is shown to move from a non-dispensing position to a dispensing position, shown as plateau 64. While the turntable spins at the dispense speed, and while the arm is in the dispensing position, photoresist solution is applied to the substrate, shown as plateau 69, ending at point 59.

The end of the photoresist solution dispense can be an important moment, because it precedes a number of time-sensitive commands or process steps. Moreover, the moment of the end of dispense can vary because of reasons including the timing of earlier steps or process imperfections relating to dispense, such as pump and fluid behavior or filter clogging. Thus, while not necessarily so, and while other trigger events can also be used, the end of dispense of the photoresist solution can be a particularly convenient trigger event for a photoresist spin-coating process (see below).

At the end of dispense of the photoresist solution, the arm moves out of the way and back to a non-dispensing position. FIG. 4 shows how this can be preferably accomplished to move from the end of photoresist solution dispense to a final spin speed in the shortest amount of time (to expedite acceleration to casting speed). The arm is first moved sufficiently out of the way to accelerate the substrate to casting spin speed, e.g., to the edge of the substrate. The substrate is then accelerated to the final spin speed as soon as possible. (Line segment 65 shows acceleration of the spin motor from a dispense speed to a casting speed.) After acceleration and/or achieving final spin speed, the arm is moved into the fully non-dispensing position (line segment 67). (This movement of the dispense arm can be a time-sensitive step.)

Upon application of a desired amount of photoresist solution onto the substrate, the substrate is accelerated to a final or cast spin speed (see section -B-, including line segment 65). The timing of this step has significant effect on the final thickness of a spin-coated photoresist, and as noted, the beginning and end of acceleration of the turntable from the dispense speed are both preferably executed with interrupted control methods. The final speed and the duration of the casting speed segment should be designed to result in a desired film thickness. Generally, thicknesses of up to about 50 microns are desired, down to thicknesses of less than 5, 1, or 0.5 micron. The coating should preferably be coated to very narrow tolerances with respect to thickness and thickness uniformity, and with the process control described herein, using interrupted timing control for process command execution, uniformities of less than 15 angstroms (3 sigma) preferably less than 5 angstroms (3 sigma) can be attained both intra- and inter-wafer. These values are measured of the coating after soft bake and prior to masking and exposure of the photoresist.

Optionally, multiple spin-coating apparatus or bowls can be used in a cluster of processing equipment, including within the cluster other equipment such as spin-coating apparatuses for applying developing solution, hot plates, and chill plates, etc. Each of the multiple bowls for spin-coating photoresist will exhibit its own characteristics, possibly including variations in coating thickness (on average) relative to the other bowls of the cluster, with all parameters and conditions being set and controlled identically. These thickness variations can be compensated for by lengthening or shortening the amount of time the substrate is spun in the final or cast spin step (plateau 71 in FIG. 4). Preferably, this can be done by starting the acceleration to cast spin speed either slightly earlier or slightly later (point 73 of FIG. 4 can be executed slightly earlier or slightly later).

After casting portion -B- is the edge bead removal and backside wash portion, identified as portion -C-. This includes rotation at a speed similar to the dispense speed, movement of the dispense arm as shown, to the edge of the substrate, and dispensing an edge bead removal solvent from the dispense arm onto the substrate's edge to remove photoresist material that has beaded up on the edge. While this occurs, the backside of the substrate is rinsed, e.g., with streams of edge bead removal solvent.

The substrate can be processed further, typically by exposing the photoresist layer to radiation through a mask (and possibly one or more other steps such as bake and/or chill steps).

Figure 5:
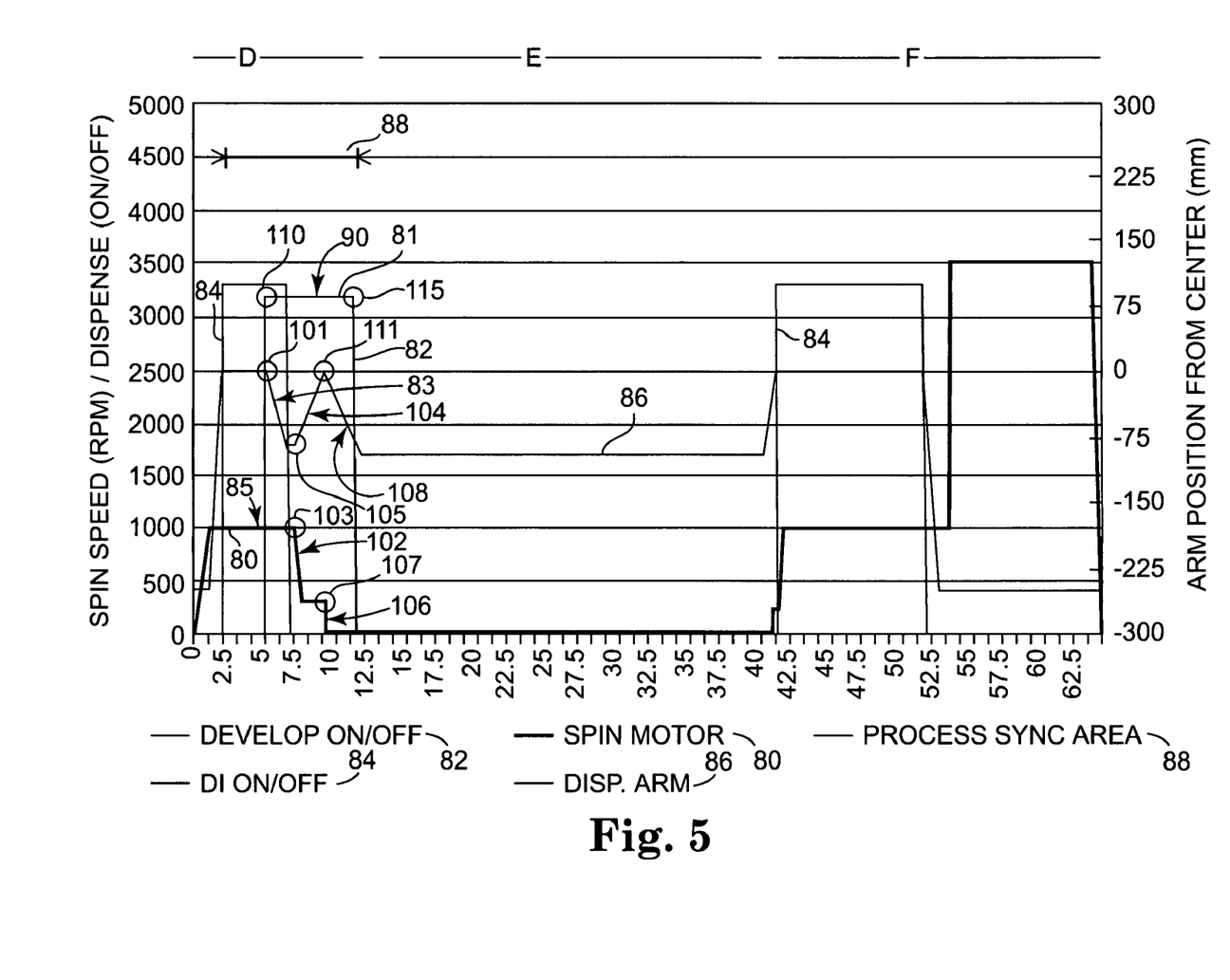
FIG. 5 is a diagram of steps of a process for applying a developer solution onto a substrate using a spin-coating apparatus.

A developer solution can be applied to the substrate over the exposed photoresist. Some general steps of applying a developer solution using spin-coating are illustrated in FIG. 5. These include a first portion wherein developer is applied to the surface of the substrate ("dispense" or "puddle formation" portion -D-). This is followed by a "puddle time" portion -E-, which allows the developer solution to react with and dissolve regions of the photoresist. The puddle time portion is followed by a rinse and spin dry portion -F-. During the rinse portion, additional processing solution such as deionized water or developer solution may be dispensed onto the substrate to carry away the dissolved photoresist. Final drying can take place as desired, e.g., using elevated temperature, centripetal energy, and/or reduced pressure.

According to the invention, at least a portion of the developing solution coating process is controlled using interrupt timing methods as described herein. A preferred portion for using such control is portion -D-, relating to developer solution dispense, described in greater detail below.

The developer solution can be applied to the surface of a substrate in any manner that will effectively allow reaction with and removal of regions of the developed photoresist. A developer solution is typically applied to a photoresist layer in a manner such that the developer solution will evenly interact with and develop the layer of photoresist material, causing either the exposed or unexposed area to dissolve, and allowing that portion to be washed away to leave behind a positive or negative pattern of the mask. The developer solution can preferably be applied to minimize the amount of mechanical impingement, or to make such impingement uniform over a substrate's surface, and also to provide as much uniformity as possible with respect to the amount of time that the photoresist surface is in contact with developer solution. Ideally, the developer will be applied to and contact all areas of the photoresist surface equally, for an equal amount of time, resulting in uniform developing of the photoresist. In spin-coating methods, this can be approximated by applying the developer solution in a circular or spiral pattern, e.g., by rotating the substrate and either using movement of the dispenser to form a spiral pattern, or using manifold points of dispense to form a number of circular patterns.

The degree of uniformity and consistency of the application of the developer solution over a (preferably) uniform coated photoresist can be measured by considering the uniformity with which the photoresist was developed, which can be measured, e.g., by considering the size (typically width) and uniformity of the features remaining after development and removal of portions of the photoresist. Measurement of this value can be taken, after baking the substrate following developing and removal of regions of photoresist. Typically, this means considering line width of remaining features using a test called line width repeatability. By use of methods of the present invention, photoresist layers can be produced having line width repeatability of 9 nanometers (3 sigma) intra-wafer, and 6 nanometers (3 sigma) inter-wafer.

Generally, an amount of developer solution in the range from about 30 to 50 milliliters, preferably about 40 milliliters (e.g., for a substrate having a diameter of 200 millimeters) can be applied in a generally even and uniform layer over the entire surface of photoresist. Of course more or less may be used if desired for any reason. Optionally, another processing solution, e.g., deionized water, can be dispensed onto the substrate prior to or in combination with the photoresist solution, to pre-wet the substrate and to improve interaction between the coated photoresist and the developer solution.

FIG. 5 illustrates exemplary steps used in a method of applying a developer solution to a substrate surface, over an exposed layer of photoresist. (The photoresist would have preferably but not necessarily been applied using spin-coating). Line 80 represents the speed of the spin motor. Light line 82 represents dispensing of developer solution. Line 84 represents dispensing of deionized water. Line 86 represents the position of the dispense arm. And line 88 identifies a time-sensitive portion for the developer dispense process.

Referring to FIG. 5, the turntable spin speed is initially accelerated to a first speed, plateau 85, for dispensing developer solution. The dispense arm moves into a dispensing position at the center of the substrate, and begins pre-wetting the substrate surface by dispensing deionized water, as shown by line 84. Dispense of developing solution occurs (plateau 90), and the dispense arm moves from the center of the substrate to the edge of the substrate (line segment 83). Dispensing of developing solution continues as the dispense arm pauses slightly at the substrate, at which time the turntable speed is reduced (line segment 102). The dispense arm then returns (line 104) to the center of the substrate (point 111) where turntable speed is again reduced (line segment 106) and then back to the substrate edge (line segment 108). Around this point, dispensing of developer solution ends (point 115) and the turntable stops.

According to the invention, a spin-coating process is controlled using an interrupt process control system, wherein serial control of the process is interrupted by an interrupt signal, whereupon the process control system executes a pre-programmed process command and then returns to serial control. The interrupt signal can be external or internal (from the process control system, in the form of a software interrupt). For example, the interrupt signal may be a software signal programmed into the process control system to be sent at a programmed time or upon occurrence of an event detected within a software program; or the interrupt signal may be a hardware interrupt such as a discrete signal from a component of a spin-coating apparatus such as a sensor, controller, pump, dispenser, turntable, timer, etc. A hardware interrupt is an interrupt signal from a piece of hardware, and is preferably a discrete signal sent directly to the CPU, e.g., through a hard-wired connection.

The process command that is executed upon interruption can be generally any command that is a part of the spin-coat process. The method is especially useful for controlling the timing of time-sensitive commands. Time-sensitive commands are process commands that relate to a process step whose timing, e.g., at magnitudes in the range of milliseconds, can have a measurable effect on uniformity of a coated or applied processing material, specifically including commands that can affect either a photoresist thickness or line width repeatability. Examples of time-sensitive commands include movements of hardware components such as turntable movement (e.g., acceleration or deceleration), dispenser movement, and starting or ending of solution dispensing from a dispenser. Timing of turntable movements can be particularly critical to spin-coated film thickness, because speed, duration, and acceleration of the turntable to distribute a processing solution (especially a photoresist solution) into a uniform thin film, will affect the end thickness and uniformity of the film that is produced.

The interrupt signal can be sent to the CPU, upon occurrence of a "process event" (also referred to as a "trigger event"). The terms "process event" and "trigger event" are used interchangeably to refer to events that occur or are programmed to occur in a spin-coating process, and that can be detected or recognized by the CPU in the process control system whenever the system is sent an interrupt signal. A trigger event can preferably be related to an event that either shortly precedes a time-sensitive command, or an event that either shortly precedes or initiates a time-sensitive period (a portion of a process that includes one or more time-sensitive commands).

A preferred trigger event can be different for different types of processes, such as for a photoresist spin-coating process versus a developer solution application process. Because a photoresist spin-coating process includes time-sensitive commands after the end of solution dispense, and because the end of solution dispense for a given amount of a solution can vary, a convenient trigger event for a photoresist spin-coating process can be the end of the photoresist solution dispense (point 59 of FIG. 4). For developer solution application processes, some of the steps immediately following the start of solution dispense can be time-sensitive, so a convenient trigger event for developer solution application can be the start of dispense (point 110 of FIG. 5).

Upon receiving the interrupt signal, the CPU executes one or more process commands according to a set of pre-programmed instructions relating to the interrupt signal, e.g., by executing an interrupt service routine ("ISR"). The interrupt service routine may include instruction to execute only a single process command, or may include instructions to execute multiple process commands. In either case, either a single process command or one or more of multiple process commands may be delayed from the trigger event or may be executed upon the occurrence of the trigger event. The duration of the one or more delays can be measured by one or more timers in the process control system. At the end of each duration, the ISR will send out another interrupt signal that will be recognized by the process control system, and the process control system will execute the delayed process command according to the ISR.

In one embodiment, a trigger event causes the process control system to execute an interrupt service routine which contains multiple timers to measure multiple durations of delay. The interrupt service routine starts one timer running for each delay, and upon reaching the end of each delay, the interrupt service routine sends another interrupt signal to the processor, which recognizes the interrupt signal and executes a corresponding (pre-programmed) process command. After the process command is executed, the process control system returns to serial control until it is again interrupted by another interrupt signal sent when another of the timers reaches the end of its measured duration or upon receiving another interrupt signal such as a hardware interrupt. While it is often convenient to measure each duration from the same starting point, e.g., the trigger event or interrupt signal, it is not required that different durations of an ISR are all measured from the same start. The interruption may take the CPU away from the general control mode for a period of about 10 to 100 milliseconds, after which the process control system returns to serial control until it receives another interrupt signal.

The process control system can be programmed or pre-programmed (e.g., by pre-scanning or pre-programming a program e.g., including an ISR, into the process control system before running the spin-coating apparatus) to recognize one or more different interrupt signals. The pre-scanning can also include programming an ISR that corresponds to each of the different interrupt signals. When each interrupt signal is received, the process control system will respond by executing the ISR that corresponds to the particular interrupt signal received.

Figure 6:
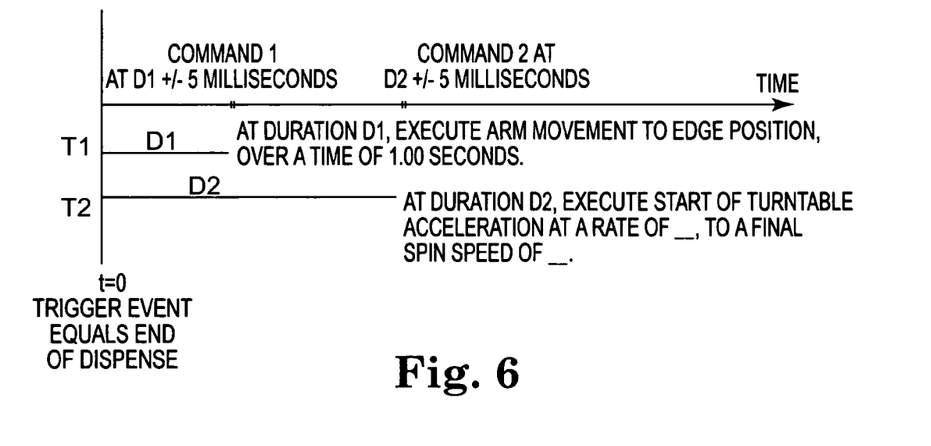
FIG. 6 illustrates interrupted control of a portion of the steps of the diagram FIG. 4.

FIG. 6 illustrate a portion of the spin-coat process of FIG. 4, controlled using interrupt timing control and parallel timers that time process durations from a single trigger event. FIG. 6 shows a trigger event occurring during the spin-coating process. Preferably this can be chosen as the end of dispense of the photoresist solution. When the end of dispense is detected (by any mechanism, such as through the supply system, the dispenser, or otherwise), a discrete signal is sent to the CPU.

The trigger event is represented in FIG. 6 as the vertical line also representing t=0. One or more timers (T1 and T2 in the figure) begin running, each for a preset duration from time zero and the trigger event.

According to this embodiment of the invention, one process command is executed at the end of each duration. The earliest process command is executed after the shortest duration (duration D1 in FIG. 6). Upon reaching the end of the duration, the interrupt service routine will send another interrupt signal (signaling the end of duration D1) to the central processing unit. The CPU will act as it is programmed to act upon receiving the signal relating to the end of duration D1, and will execute the appropriate process command. Here, for example, the process command can be movement of the dispense arm from above the center of the substrate to an edge (line segment 95 of FIG. 4). After the process command is executed, serial control is resumed. Upon reaching the end of duration D2, another interrupt signal is sent out, interrupting serial control to execute another process command. In the case of this example, the second process command can be start of acceleration of the turntable to cast speed. (Point 73, FIG. 4).

Figure 7:
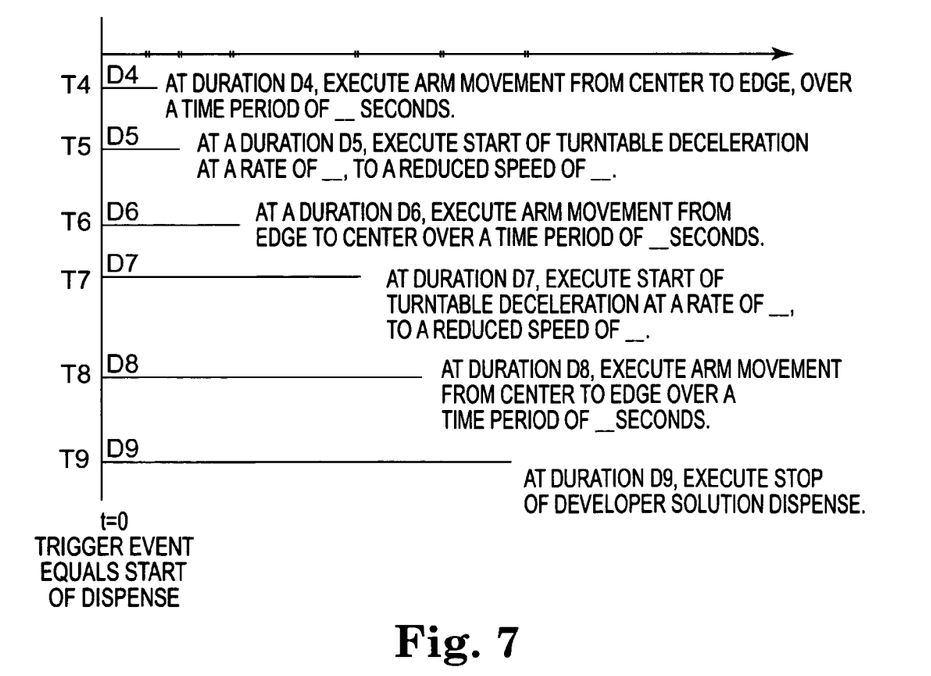
FIG. 7 illustrates interrupted control of a portion of the steps of the diagram of FIG. 5.

FIG. 7 illustrates a portion of the spin-coat process of FIG. 5, controlled using interrupt timing control and parallel timers that time process durations from a single trigger event. FIG. 7 shows events following a trigger event occurring during the spin-coating application of a developer solution. Preferably the trigger event can be chosen as the start of dispense of the developer solution (point 110 of FIG. 5) so that time-sensitive commands that closely follow the start of dispense can be timed from the start of dispense.

When the start of dispense is detected, a discrete signal is sent to the CPU (e.g., the supply systems controller 33 sends a discrete signal to the CPU 30 (see FIG. 3)). The trigger event is represented in FIG. 7 as the vertical line also representing t=0. Timers (T4, T5, T6, T7, T8, and T9 in the figure) begin running, each for a preset duration from time zero.

At the end of duration D4 (point 101 of FIG. 5), the interrupt service routine sends a signal to the CPU to interrupt serial processing and execute a command moving the dispense arm from a position over the center of the substrate to a position over its edge (line segment 83 of FIG. 5).

At the end of duration D5 (point 103 of FIG. 5), the interrupt service routine sends a signal to the CPU to interrupt serial processing and execute a command decelerating the turntable at a given rate, to a reduced speed (line segment 102 of FIG. 5).

At the end of duration D6 (point 105 of FIG. 5), the interrupt service routine sends a signal to the CPU to interrupt serial processing and execute a command moving the dispense arm from a position over the edge of the substrate to a position over its center (line segment 104 of FIG. 5).

At the end of duration D7 (point 107 of FIG. 5), the interrupt service routine sends a signal to the CPU to interrupt serial processing and execute a command decelerating the turntable at a given rate, to a reduced speed (line segment 106 of FIG. 5).

At the end of duration D8 (point 111 of FIG. 5), the interrupt service routine sends a signal to the CPU to interrupt serial processing and execute a command moving the dispense arm from a position over the center of the substrate to a position over its edge (line segment 108 of FIG. 5).

At the end of duration D9 (point 115 of FIG. 5), the interrupt service routine sends a signal to the CPU to interrupt serial processing and execute a command stopping dispense of the developing solution.

Through all of the steps of the spin-coating process, a process control system acts according to its pre-programmed instructions, e.g., software instructions. This includes the instructions relating to serial control, software interrupt signals, interrupt service routines, etc. The control process system can be programmed to execute instructions based on priorities, which allows the system to be interrupted while executing a relatively lower priority command (e.g., a serial control subroutine) to execute a command of a higher priority (e.g., a command from an interrupt service routine). The process control system is programmed or pre-programmed to recognize signals such as interrupt signals, and to respond by executing the appropriate command, such as an ISR.

The inventive process control reduces or eliminates timing variabilities that exist in serial control methods. Process commands can be executed and delay durations can be measured to within the accuracy of the timing device measuring the duration, which for modern computers can be to within about 5 milliseconds, or even to an accuracy within 1 millisecond or less. Furthermore, process commands can be measured independently, i.e., in parallel, so variabilities present in the timing of execution of earlier commands will not propagate and accumulate into the timing of subsequent processing commands.

Figure 8:
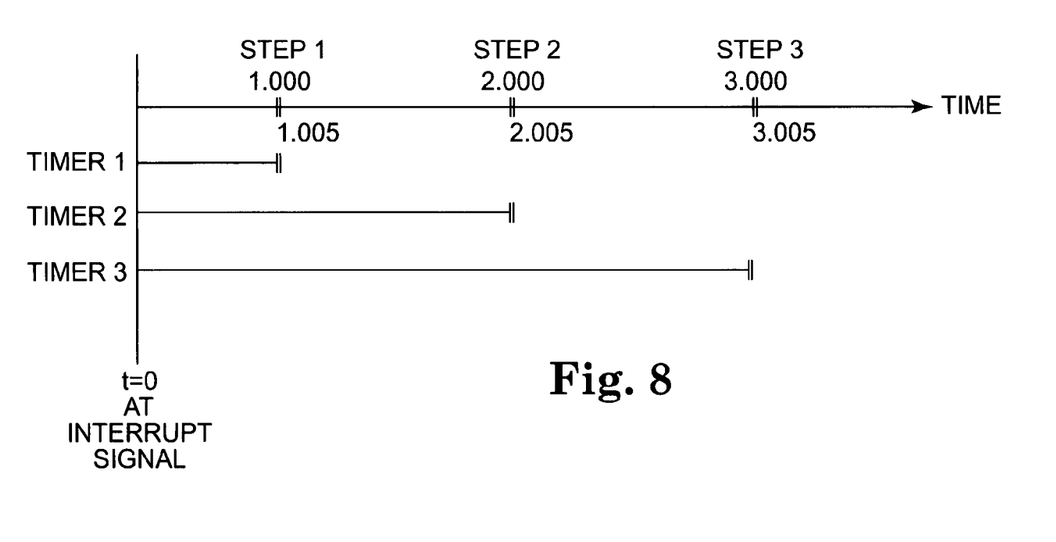
FIG. 8 illustrates a timeline of steps of a process controlled using interrupted timing, in particular interrupted timing with multiple timers controlling different durations in parallel.

FIG. 8 illustrates this aspect of the invention generally, by illustrating the variabilities present in one or multiple steps controlled with interrupted, preferably parallel timing, according to the invention. FIG. 8 shows a first step being executed from an interrupt at a time in the range from 1.000 to 1.005 seconds. A second step, timed with a parallel timer, is executed at a time in the range from 2.000 to 2.005 seconds, and a third step executes at a time from 3.000 to 3.005 seconds. Referencing FIG. 2 shows that the variabilities associated with the inventive method compare favorably to the variabilities associated with serial control.

Following is a summary of data comparing line widths of spin-coated photoresist layers prepared with and without using the interrupt-driven serial process control described herein for application of a developer solution onto a layer of photoresist that was applied using spin-coating and interrupt-driven serial process control. More specifically, the data compares groups of wafers that were identically coated with a photoresist layer, and wherein one group was coated using standard serial process control to apply a developer solution ("NON-SYNC," meaning non-synchronized process), and wherein two other groups had developer solution applied using process control according to the invention ("SYNC and SYNC#2).

Twenty-five silicon wafers (200 mm diameter) were spin-coated with a photoresist solution using interrupt-driven serial process control according to the invention, followed by application of a developer solution using spin-coating and round robin serial control (non-interrupted). Critical dimension measurements of each photoresist were measured using scanning electron microscopy (SEM) at 55 different Site Locations uniformly distributed on each wafer, with the Site Locations being in the same relative position on each of the 25 wafers. ("Critical dimension" refers to a line width of a performance-characteristic feature of a device). The target critical dimension (CD) was 140 nanometers. The Y-axis of FIG. 9 reports the mean of the 25 measured line widths at each of the 55 sites (mean CDs (nm)), versus the 55 site locations (X-axis). The mean line width of the 25 measurements, averaged over each of the 55 site locations of the NON-SYNC wafers, was 138.9 nanometers. The three-standard deviations from mean for each of the 25 wafers measured, at each of the 55 site locations, is also reported in FIG. 9. The average of three standard deviations over the 55 site locations was 11.71.

Figure 9:
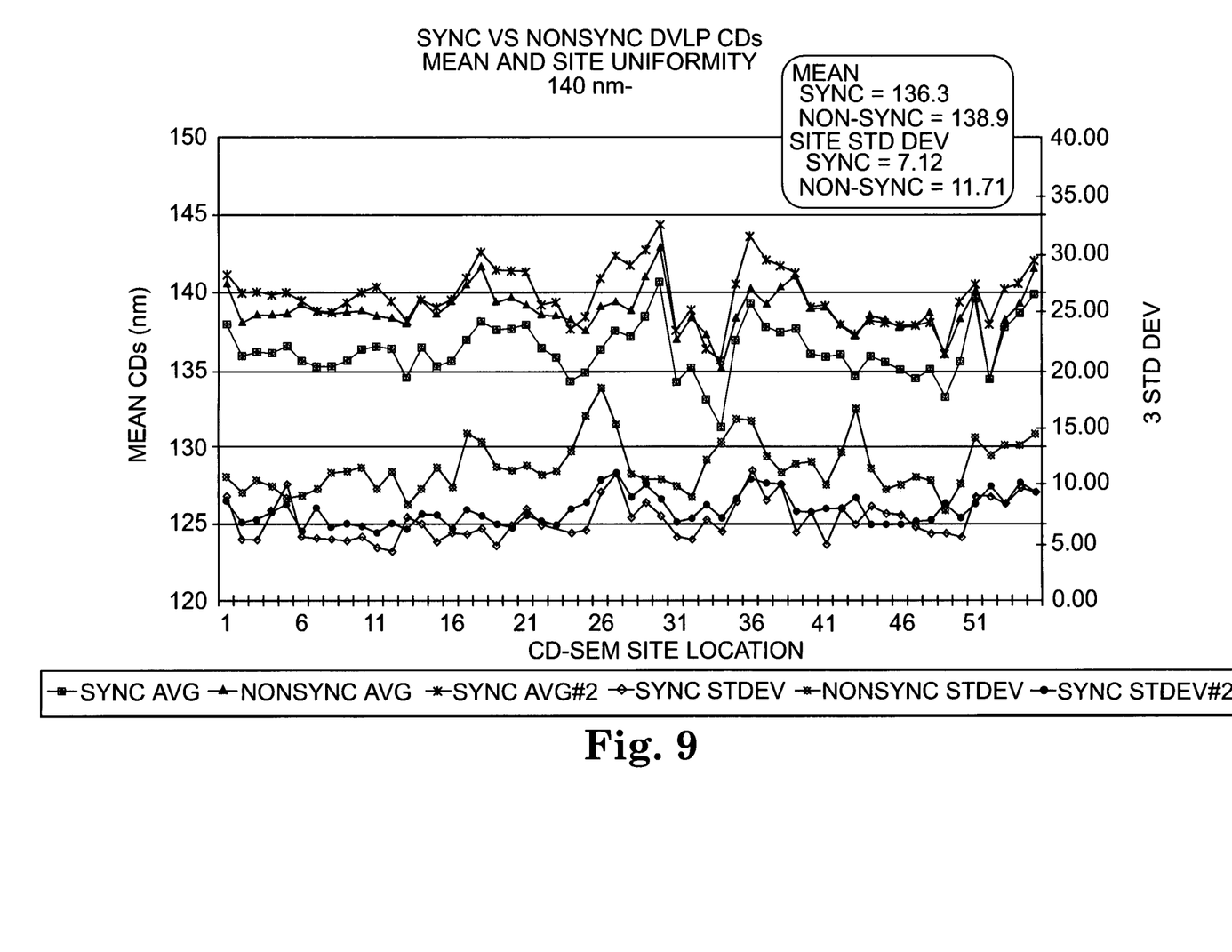
FIG. 9 is a graph of data comparing process control methods that incorporate the invention to process control methods that do not.

Another batch of 25 wafers (SYNC) was coated with photoresist solution using interrupted process control and serial timers, the same as the NON-SYNC wafers. The photoresist layer was selectively developed and removed by application of a developer solution by spin-coating, also using interrupted process control and serial timers. Measurements were taken as with the 25 SYNC wafers. Critical dimension was measured at the 55 site locations corresponding to the locations of the NON-SYNC wafers, and the mean of each of these 25 measurements at each of the 55 Site Locations is reported in FIG. 9. The average of the mean critical dimension measurement was 136.3. FIG. 9 also reports three standard deviations from the mean for the 25 measurements at each of the 55 Site Locations. The average of values of the three standard deviations over the 55 Site Locations was 7.12.

Yet another batch of 25 wafers (SYNC#2) was processed and analyzed in a fashion identical to that used to prepare and analyze the 25 SYNC wafers. FIG. 9 reports the mean of the 25 CD measurements (one from each wafer) versus the 55 Site Locations. And, FIG. 9 reports the standard deviation from the mean of the 25 measurements, at each of the 55 locations.

The data show that using interrupted process control according to the invention can reduce the standard deviation from the mean critical dimension measurement.

We claim:

1. A method for providing a photoresist coating onto a substrate, the method comprising:
    spin-coating a photoresist solution onto the substrate wherein the spin-coating process is controlled by a method comprising:
        controlling the process using serial process control sequentially executing a series of subroutines;
        interrupting the serial process control with a hardware interrupt signal to execute a process command; and
    applying a developer solution onto the spin-coated photoresist using a spin-coating apparatus wherein the spin-coating apparatus is controlled by a method comprising:
        controlling the process using serial process control sequentially executing a series of subroutines; and
        interrupting the serial process control with a hardware interrupt signal to execute a process command.

2. The method of claim 1 wherein the hardware interrupt signal is a signal from a component of the spin-coating apparatus selected from the group consisting of a sensor, a controller, a pump, a dispenser, a turntable, and a timer.

3. The method of claim 2 wherein the hardware interrupt signal is sent from a supply system controller upon occurrence of a start of solution dispense or an end of solution dispense, or both.

4. A method for controlling a process of applying a developer solution onto a substrate using a spin-coating apparatus, the method comprising:
    controlling the process using serial process control wherein the process is controlled by sequentially executing a series of subroutines; and
    interrupting the serial process control with an interrupt signal to execute a process command, wherein the interrupt signal relates to a process event chosen from the group consisting of: a beginning of a dispenser movement into dispensing position; an end of a dispenser movement into dispensing position; a beginning of a solution dispense; an end of a solution dispense; a beginning of dispenser movement out of dispensing position; and an end of dispenser movement out of dispensing position.

5. The method of claim 4 wherein serial process control is interrupted using an interrupt signal which causes execution of an interrupt service routine.

6. The method of claim 5 wherein the interrupt service routine starts multiple timers, each timer measures a different duration, and at the end of each duration the interrupt service routine sends an interrupt signal to the process control system which executes a process command.

7. The method of claim 4 wherein the method avoids accumulation of timing variability in processing commands otherwise caused by serial timing methods.

8. A method for controlling a process of applying a developer solution onto a substrate using a spin-coating apparatus, the method comprising:
    controlling the process using serial process control wherein the process is controlled by sequentially executing a series of subroutines; and
    interrupting the serial process control with an interrupt signal to execute a process command, wherein the process command is chosen from the group consisting of: a start of dispenser movement; a start of dispense of a developer solution; an end of dispense of the developer solution; a change of turntable spin acceleration or deceleration.

* * * * *